(12) United States Patent
Kurita et al.

(10) Patent No.: US 7,213,334 B2
(45) Date of Patent: May 8, 2007

(54) METHOD FOR MANUFACTURING DOUBLE-SIDED FLEXIBLE PRINTED BOARD

(75) Inventors: Hideyuki Kurita, Kanuma (JP); Masanao Watanabe, Kanuma (JP)

(73) Assignees: Sony Corporation, Tokyo (JP); Sony Chemical & Information Device Corporation, Tokyo (JP)

(*) Notice: Subject to any disclaimer, the term of this patent is extended or adjusted under 35 U.S.C. 154(b) by 158 days.

(21) Appl. No.: 10/735,679

(22) Filed: Dec. 16, 2003

(65) Prior Publication Data

US 2004/0131765 A1 Jul. 8, 2004

Related U.S. Application Data

(62) Division of application No. 09/459,895, filed on Dec. 14, 1999, now Pat. No. 6,705,007.

(30) Foreign Application Priority Data

Dec. 28, 1998 (JP) .................. 10-373092

(51) Int. Cl.
*H01K 3/10* (2006.01)

(52) U.S. Cl. .............. 29/852; 29/830; 29/846; 427/96.1; 427/96.9; 427/97.1; 427/97.2; 427/97.7; 361/750; 428/209; 428/458; 428/473.5; 428/901; 174/254

(58) Field of Classification Search ............ 29/830, 29/831, 846, 852; 427/96, 97; 361/749, 361/750, 751; 174/254; 428/458, 209, 901, 428/473.5

See application file for complete search history.

(56) References Cited

U.S. PATENT DOCUMENTS

| | | | | |
|---|---|---|---|---|
| 4,336,100 A | * | 6/1982 | Passlick ................ | 216/19 |
| 5,570,506 A | * | 11/1996 | Tawata et al. ........... | 29/851 |
| 6,016,598 A | | 1/2000 | Middelman et al. | |
| 6,180,261 B1 | * | 1/2001 | Inoue et al. ............ | 428/626 |
| 6,291,895 B1 | | 9/2001 | Taniguchi et al. | |

FOREIGN PATENT DOCUMENTS

| | | |
|---|---|---|
| DE | 1765926 | 8/1968 |
| DE | 3121131 A1 | 6/1983 |
| EP | 0 411 772 A2 | 2/1991 |
| EP | 0 411 772 A3 | 2/1991 |
| JP | A-60-157286 | 8/1985 |
| JP | A-60-243120 | 12/1985 |
| JP | A-63-239998 | 10/1988 |
| JP | 01053591 | 3/1989 |
| JP | A-1-245586 | 9/1989 |

(Continued)

OTHER PUBLICATIONS

Kobunshi Ronbunshu, Polyamide Resin handbook, 1990, 47 (6).

(Continued)

*Primary Examiner*—Richard Chang
(74) *Attorney, Agent, or Firm*—Oliff & Berridge, PLC

(57) ABSTRACT

A double-sided flexible printed board is manufactured by: (a) forming a polyimide precursor layer on a metal layer; (b) forming an upper circuit layer on the polyimide precursor layer by a semi-additive technique; and (c) imidating the polyimide precursor layer to form a polyimide insulating layer.

6 Claims, 2 Drawing Sheets

FOREIGN PATENT DOCUMENTS

| | | |
|---|---|---|
| JP | 02273984 | 11/1990 |
| JP | A-3-123093 | 5/1991 |
| JP | 05110216 | 4/1993 |
| JP | A-5-139027 | 6/1993 |
| JP | A-5-291727 | 11/1993 |
| JP | 06112605 | 4/1994 |
| JP | 06286053 | 10/1994 |
| JP | 07001193 | 1/1995 |
| JP | B2-2746643 | 2/1998 |

OTHER PUBLICATIONS

Nikkan Kogyo Shinbunsha, Polyamide Resin handbook, 1998, p. 536.

* cited by examiner

METHOD FOR MANUFACTURING DOUBLE-SIDED FLEXIBLE PRINTED BOARD

This is a Divisional of Application No. 09/459,895 filed on Dec. 14, 1999 now U.S. Pat. No. 6,705,007. The entire disclosure of the prior application is hereby incorporated by reference herein in its entirety.

BACKGROUND OF THE INVENTION

1. Field of the Invention

The present invention relates to a method for manufacturing a double-sided flexible printed board using a polyimide insulating layer.

2. Related Art of the Invention

The following boards are commonly used as conventional polyimide-based double-sided flexible printed boards: (i) boards comprising copper foil, a thermoplastic polyimide adhesive, a non-thermoplastic polyimide film, and a thermoplastic polyimide adhesive and copper foil; (ii) boards comprising copper foil, a thermoplastic polyimide adhesive layer, and another copper foil, where the (i) and (ii) boards are fabricated by high-temperature pressing, heat lamination, or the like into a layered structure and (iii) boards fashioned by techniques in which a non-thermoplastic polyimide is cast-molded on copper foil and then a copper layer is formed by sputtering followed by electrolytic plating on the non-thermoplastic polyimide yield a layered structure that comprises copper foil, a non-thermoplastic polyimide film, and a copper layer comprised of a copper sputtered thin film and an electrolytic copper plating film formed thereon.

The double-sided flexible printed boards in (i) are disadvantageous, however, in that they have inadequate heat resistance because of the thermoplastic nature of the adhesive. The double-sided flexible printed boards in (ii) are disadvantageous in that their heat resistance is inadequate because of the thermoplastic nature of the adhesive layer and that their dimensional stability is inadequate because shrinkage is apt to occur during heating. The double-sided flexible printed boards in (iii) are disadvantageous in that the electrolytic copper plating layer containing a copper sputtered thin film on the non-thermoplastic polyimide film has relatively low peel strength, unsatisfactory reliability, and inferior long-term aging characteristics under conditions of heating and humidification.

To overcome these shortcomings, it has recently been proposed to use double-sided flexible printed circuit boards (metal foil/polyimide/metal foil) fabricated by a method in which a highly wettable polyamic acid varnish is applied to each of two metal foil and dried to give two laminates (each having such a polyamic acid layer); each metal foil is patterned, and the polyamic acid layers are imidated while laminated under conditions of high temperature and pressure to form a polyimide insulating layer (Japanese Patent No. 2746643). Such double-sided flexible printed circuit boards have excellent heat resistance and dimensional stability, develop adequate adhesion between the polyimide layer and the metal foil on both sides, and possess proper long-term aging characteristics.

When, however, the polyamic acid layers are laminated each other under conditions of high temperature and pressure following metal foil patterning, there is a danger that the moisture generated during imidation will corrode the metal foil without evaporating from the polyimide layer. Another drawback is that such double-side patterning impairs handling and results in reduced manufacturing efficiency. Yet another drawback is the need to provide high positional accuracy for lamination.

SUMMARY OF THE INVENTION

An object of the present invention, which was perfected in order to overcome the above-described drawbacks of prior art, is to provide a double-sided flexible printed board that has excellent heat resistance and dimensional stability, possesses adequate long-term aging characteristics and adhesion between the polyimide layer and the metal layers on both sides thereof, is devoid of problems associated with the corrosion of metal layers by the moisture generated during imidation, is easy to manufacture due to its excellent handling, and is devoid of problems associated with positional accuracy.

The inventors perfected the present invention after making the following discovery with respect to a laminate configured such that a polyamic acid layer or other polyimide precursor layer is sandwiched between two metal layers when the polyimide precursor layer is imidated following the patterning of the metal layer on one side: (I) the moisture generated during imidation evaporates off through the patterned metal layer, making it possible to prevent the metal layer from being corroded by the moisture generated during imidation, (II) adequate long-term aging characteristics can be obtained because the polyimide insulating layer obtained by imidation has excellent heat resistance and dimensional stability, and adheres well to the metal layers on both sides, and (III) excellent handling is achieved because patterning is not performed on one side of the metal layers during imidation, so fabrication is facilitated, and there is no need to ensure excessively high positioning accuracy for lamination.

Specifically, the present invention provides a method for manufacturing a double-sided flexible printed board which comprises the following steps of:

(a) forming a polyimide precursor layer on a first metal layer;

(b) forming a second metal layer on the polyimide precursor layer;

(c) patterning the second metal layer by a subtractive technique to form a second circuit layer or (c') patterning the first metal layer by a subtractive technique to form a first circuit layer; and (d) imidating the polyimide precursor layer to form a polyimide insulating layer.

The present invention also provides a method for manufacturing a double-sided flexible printed board which comprises the following steps of:

(A) forming a polyimide precursor layer on a metal layer;

(B) forming an upper circuit layer on the polyimide precursor layer by a semi-additive technique; and (C) imidating the polyimide precursor layer to form a polyimide insulating layer.

Other objects and features of the present invention will be described or become apparent from the following disclosure.

DETAILED EXPLANATION OF THE INVENTION

Figure 1:
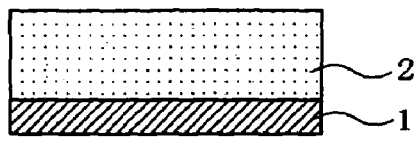
FIGS. 1A, 1B, 1C, 1C', 1D, 1E, 1F, 1M and 1M' are diagrams illustrating the steps involved in the manufacture of the double-sided flexible printed board of the present invention.
Figure 1:
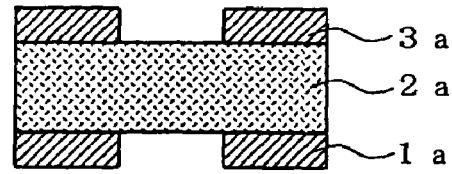
Figure 1:
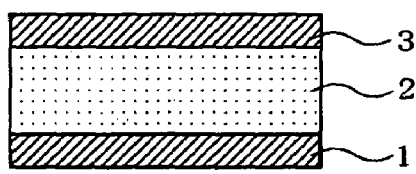
Figure 1:
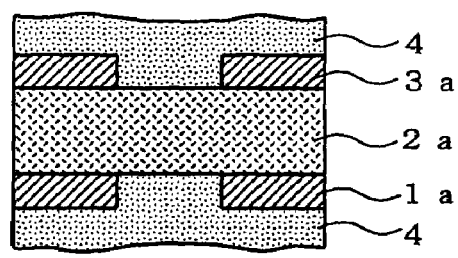
Figure 1:
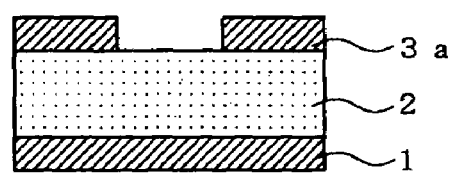
Figure 1:
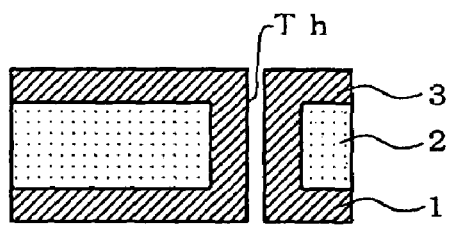
Figure 1:
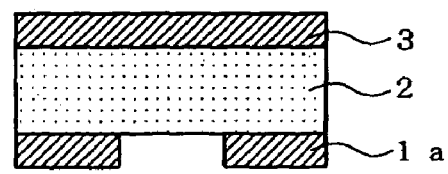
Figure 1:
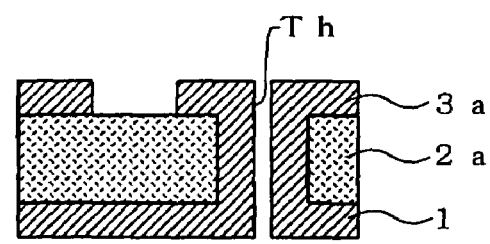
Figure 1:
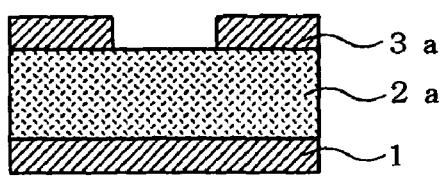

A detailed, step-by-step explanation of the present invention will now be given with reference to drawings.

FIGS. 1A to 1M' depict an example in which an upper circuit layer is formed by a subtractive technique prior to imidation, and FIGS. 2A to 2M depict an example in which the upper circuit layer is formed by a semi-additive technique prior to imidation. The embodiment in FIGS. 1A to 1M' will first be described.

Step (a)

A polyimide precursor layer 2 is formed on a first metal layer 1 (FIG. 1A).

Specifically, a polyimide precursor varnish obtained by dissolving a polyamic acid or other polyimide precursor in N-methyl-2-pyrrolidone or the like is applied with the aid of a comma coater, knife coater, roll coater, lip coater, die coater, or the like to one side of a copper foil or another type of the first metal layer 1, and the coated layer is commonly dried by being heated to 150 to 200° C. in such a way that the content of residual volatile fractions (weight percentage of all the volatile components (solvents, water generated upon condensation, and the like) in the polyimide precursor layer) is confined to a range of 30 to 50 wt % in order to prevent the adhesive strength between the layers from decreasing, or foaming from occurring in the subsequent steps. A polyimide precursor layer 2 is thus fabricated.

Part of the polyimide precursor imidates in the drying step, but conditions should be arranged to prevent the imidation ratio of the dried polyimide precursor layer 2 from exceeding 50%. At 50% or lower, the polyimide precursor layer 2 can be patterned by photolithography in an elaborate, highly accurate, and inexpensive fashion with the aid of an alkali etching solution.

When the thickness of polyimide precursor layer 2 is excessively thin, it shows low mechanical strength and is less reliable as an insulating layer. When excessively thick, it is more difficult to ensure conductivity between the first metal layer and the second metal layer.

To prevent the double-sided flexible printed board from curling, the material used for the polyimide precursor component of the polyimide precursor layer 2 should preferably be such that the coefficient of linear thermal expansion of the imidated polyimide is substantially the same as the coefficient of linear thermal expansion of the first metal layer 1 annealed under the imidation conditions.

The following materials may be used for the polyimide precursor: polyamic acids obtained from acid dianhydrides and diamines (see Japanese Patent Application Laid-Open Nos. SHO60-157286, SHO60-243120, SHO63-239998, HEI1-245586, HEI3-123093, and HEI5-139027), and partially imidated polyimide amic acids obtained from diisocyanate compounds and polyamic acid prepolymers, which have terminal acid dianhydrides and which are synthesized from excess acid dianhydrides and diamines (see "Polymide Resin Handbook," Published by Nikkan Kogyo Shinbunsha, p. 536, 1988; *Kobunshi Toronshu*, 47 (6), 1990). Of these, polyamic acids obtained from acid dianhydrides and diamines can be used to advantage.

Preferred examples of acid dianhydrides include pyromellitic dianhydride (PMDA), 3,4,3',4'-biphenyltetracarboxylic dianhydride (BPDA), 3,4,3',4'-benzophenonetetracarboxylic dianhydride (BTDA), and 3,4,3',4'-diphenylsulfonetetracarboxylic dianhydride (DSDA). Preferred examples of diamines include 4,4'-diaminodiphenyl ether (DPE), paraphenylenediamine (PDA), 4,4'-diaminobenzanilide (DABA), and 4,4'-bis(p-aminophenoxy) diphenyl sulfone (BAPS).

The same materials as those used in conventional flexible printed boards can be used for the first metal layer 1. Examples thereof include electrolytic copper foil, SUS 304 foil, SUS 430 foil, aluminum foil, beryllium foil, and phosphor bronze foil.

The thickness of the first metal layer 1 is commonly 8 to 35 µm.

Step (b)

A second metal layer 3, which is identical to the first metal layer 1, is subsequently formed on the polyimide precursor layer 2 (FIG. 1B).

Specifically, electrolytic copper foil or another type of metal foil should be laminated as the second metal layer 3 to the polyimide precursor layer 2 by means of hot pressing, roll lamination, or the like. Alternatively, a thin film of copper or another metal may be laminated by sputtering to the polyimide precursor layer 2, and a metal plating layer of electrolytic copper or the like may be laminated on top thereof to form a second metal layer 3.

Step (c)

The second metal layer 3 is subsequently patterned by a subtractive technique involving the use of a photolithographic method that allows patterning to be performed with fine and precise alignment, yielding a second circuit layer 3a (FIG. 1C). Specifically, the following procedure may be adopted: the surface of the first metal layer 1 is covered with a protective film (preferably an easily peelable, lightly adhesive tape), a conductor circuit pattern resistor layer is then formed on the second metal layer 3, the second metal layer 3 is etched with a cupric chloride aqueous solution or other etching solution to form a second circuit layer 3a, and the conductor circuit pattern resistor layer and the protective film are then peeled off.

Step (c')

Although the second metal layer 3 was patterned in step (c), the first metal layer 1 may also be patterned. In more specific terms, the first metal layer 1 is patterned by a subtractive technique based on the use of photolithography, yielding a first circuit layer 1a (FIG. 1C'). Specifically, the following procedure may be adopted: the surface of the second metal layer 3 is covered with a protective film (preferably an easily peelable, lightly adhesive tape), a conductor circuit pattern resistor layer is then formed on the first metal layer 1, the first metal layer 1 is etched with a cupric chloride aqueous solution or other etching solution to form a first circuit layer 1a, and the conductor circuit pattern resistor layer and the protective film are then peeled off.

Step (d)

The polyimide precursor layer 2 is subsequently imidated, yielding a polyimide insulating layer 2a. The double-sided flexible printed board shown in FIG. 1D is thus obtained. The imidation conditions can be experimentally established in an appropriate manner in accordance with the type of polyimide precursor or the like. The following stepwise heating may, for example, be performed in a nitrogen gas atmosphere at atmospheric pressure: 30 minutes at 160° C., 30 minutes at 180° C., 30 minutes at 250° C., and 30 minutes at 300° C.

Moisture is generated by the dehydration reaction in the polyimide insulating layer 2a during imidation in step (d). This moisture can be evaporated off because one of the two metal layers for sandwiching the polyimide insulating layer 2a has already been patterned in step (c) (or step (c')), partially exposing the polyimide insulating layer 2a.

Steps such as those described below can preferably be performed further on the double-sided flexible printed board thus obtained (the board is shown in FIG. 1D).

Step (e)

The unpatterned first metal layer 1 or second metal layer 3 is patterned by a subtractive technique to form a first circuit layer 1a or a second circuit layer 3a (FIG. 1E). A double-sided flexible printed wiring board having patterned metal layers on both sides is thus obtained.

Step (f)

Cover coat layers 4 are formed by an ordinary method on the first circuit layer 1a and the second circuit layer 3a for protection (FIG. 1F).

The circuits on the front and back of the polyimide insulating layer 2a can be connected to each other by performing the below-described step (m) between step (b) and step (c) or (c'), or by performing the below-described step (m') subsequent to step (d).

Step (m)

A through hole Th for ensuring conductivity between the first metal layer 1 and the second metal layer 3 is formed between step (b) and step (c) or (c') in accordance with an ordinary technique (FIG. 1M).

Step (m')

A through hole Th for ensuring conductivity between the first metal layer 1 and second circuit layer 3a or between the second metal layer 3 and the first circuit layer 1a is formed subsequent to step (d) in accordance with an ordinary technique (FIG. 1M').

The embodiment in FIGS. 2A to 2M will now be described.

Step (A)

A polyimide precursor layer 22 is formed on a metal layer 21 (FIG. 2A) in the same manner as in step (a) of the embodiment in FIGS. 1A to 1M'.

Step (B)

Figure 2A:
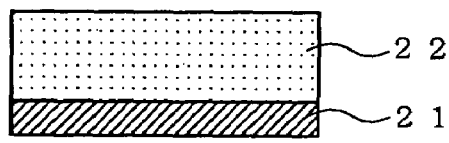
FIGS. 2A, 2B, 2C, 2D, 2E and 2M are diagrams illustrating the steps involved in the manufacture of the double-sided flexible printed board of the present invention.
Figure 2B:
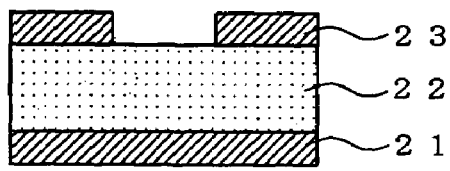

An upper circuit layer 23 is formed by a semi-additive technique on the polyimide precursor layer 22 (FIG. 2B). Specifically, the following procedure may be adopted: a protective film is pasted over the surface of the metal layer 21, a thin film of copper or the like is laminated by sputtering to the polyimide precursor layer 22, a conductor circuit pattern resistor layer is formed on the thin film, a metal plating layer of copper or the like is then laminated by electroplating, the conductor circuit pattern resistor layer is subsequently peeled off by an ordinary technique, an upper circuit layer 23 is formed by soft etching, and the protective film is then peeled off.

Step (C)

The polyimide precursor layer 22 is imidated in the same manner as in step (d) of the embodiment in FIGS. 1A to 1M', yielding a polyimide insulating layer 22a. The double-sided flexible printed board shown in FIG. 2C is thus obtained.

Moisture is generated by the dehydration reaction in the polyimide insulating layer 22a during imidation in step (C). This moisture can be evaporated off because a patterned upper circuit layer 23 has been formed on the polyimide insulating layer 22a in step (B), partially exposing the polyimide insulating layer 22a.

Figure 2C:
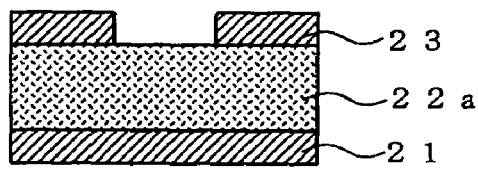

Steps such as those described below should preferably be performed further on the double-sided flexible printed board thus obtained (the board is shown in FIG. 2C).

Step (D)

Figure 2D:
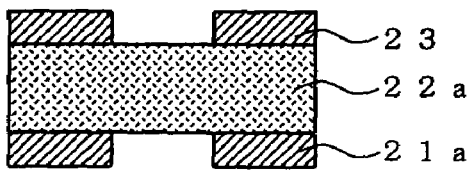
Figure 2E:
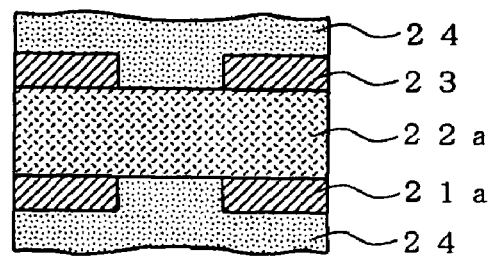

The metal layer 21 is patterned by a subtractive technique in the same manner as in step (e) of the embodiment in FIGS. 1A to 1, M' yielding a lower circuit layer 21a. The double-sided flexible printed wiring board shown in FIG. 2D is thus obtained.

Step (E)

Cover coat layers 24 are formed on the upper circuit layer 23 and the lower circuit layer 21a (FIG. 2E) in the same manner as in step (f) of the embodiment in FIGS. 1A to 1M'.

The circuits on the front and back of the polyimide insulating layer 22a can be connected to each other by performing the below-described step (M) between step (B) and step (C) or subsequent to step (C).

Step (M)

Figure 2M:
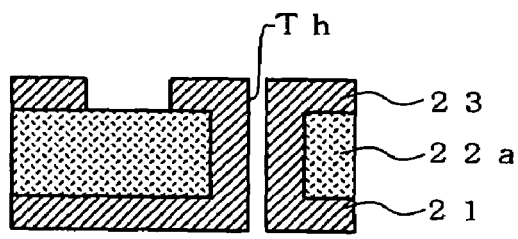

A through hole Th for ensuring conductivity between the metal layer 21 and the upper circuit layer 23 is formed between step (B) and step (C) or subsequent to step (C) (FIG. 2M).

The double-sided flexible printed board thus obtained is resistant to corrosion, has excellent heat resistance and dimensional stability, possesses excellent interlayer adhesion, demonstrates adequate long-term aging characteristics, and can therefore be used as a double-sided flexible printed board for various types of electronic equipment.

EXAMPLES

The present invention will now be described in detail.

Reference Example

Paraphenylenediamine (PDA, manufactured by Mitsui Chemical) and 4,4'-diaminodiphenyl ether (DPE, manufactured by Wakayama Seika) were dissolved in amounts of 1.05 kg (11.2 mol) and 0.86 kg (4.8 mol), respectively, in about 45 kg of the solvent N-methyl-pyrrolidone (NMP, manufactured by Mitsubishi Chemical) under a nitrogen gas atmosphere in a 60-L reaction kettle fitted with a temperature controller and a jacket. Pyromellitic dianhydride (PMDA, manufactured by Mitsubishi Gas Chemical) was then gradually added in an amount of 3.523 kg (16.14 mol) at 50° C., and a reaction was allowed to occur for 3 hours. A polyamic acid varnish with a solids content of about 12% and a viscosity of 25 Pa·S (25° C.) was thus obtained.

Working Example 1

Lower-layer copper foil with a thickness of 12 μm was coated with the polyamic acid varnish obtained in the reference example, and the solvent was vaporized in a continuous furnace at 80 to 170° C., yielding a polyamic acid layer as a polyimide precursor layer.

Upper-layer copper foil with a thickness of 12 μm was subsequently superposed on the polyamic acid layer and thermocompression-bonded thereto using a 140° C. vacuum hot press (surface pressure: 70 kg/cm$^2$).

The surface of the lower-layer copper foil was subsequently covered with a protective film, a conductor circuit pattern resistor layer was then formed on the upper-layer copper foil, and the upper-layer copper foil was etched with a cupric chloride aqueous solution or other etching solution, yielding an upper circuit layer. The conductor circuit pattern resistor layer and the protective film were then peeled off.

The laminate comprising a lower-layer copper foil, a polyamic acid layer, and an upper circuit layer was subsequently introduced into a heat-treatment apparatus, the temperature of the atmosphere inside the apparatus was raised to 230 to 350° C., and the laminate was imidated for 30 minutes at 350° C. to convert the polyamic acid layer to a polyimide insulating layer. A double-sided flexible printed board was thus obtained.

The lower-layer copper foil of the resulting double-sided flexible printed board was patterned in the same manner as the upper-layer copper foil, yielding a lower circuit layer. A double-sided flexible printed wiring board was subsequently obtained by forming polyimide cover coat layers (UR-5480, manufactured by Toray) on the upper circuit layer and the lower circuit layer.

The resulting double-sided flexible printed wiring board was tested and evaluated for its heat resistance, dimensional stability, adhesion, and long-term aging characteristics in the manner described below.

Heat Resistance

The double-sided flexible printed wiring board of Working Example 1 was cut to a predetermined shape and immersed for 60 seconds in a 320° C. solder bath. The manner in which the wiring board was affected was analyzed. The wiring board of Working Example 1 did not swell, and no pattern peeling was observed. These results suggested that the moisture content of the polyimide insulating layer had been reduced.

Dimensional Stability

A square 10 cm on a side was cut out from the double-sided flexible printed wiring board of Working Example 1 and placed on a horizontal platform, and the degree of deformation of the wiring board was measured. The deformation was low (5 mm or less).

Adhesion

The adhesive strength between the polyimide insulating layer and copper foil of the double-sided flexible printed wiring board in Working Example 1 was measured by the 90° peel strength test. The peel strength was found to be high (1.2 kg/cm).

Long-term Aging Characteristics (1) The double-sided flexible printed wiring board was taken out after being allowed to stand for 240 hours in a 150° C. oven, and the peel strength between the polyimide insulating layer and copper foil of the board was measured by the 90° peel strength test. As a result, it was found that the peel strength had not decreased (1.0 kg/cm).

(2) The board was taken out after being allowed to stand in a thermostat at a temperature of 40° C. and a humidity of 90%, and insulation resistance was then measured (by the method described in JIS C 6471). The insulation resistance was found to be 1.0×10E+12, indicating that the insulation properties were adequate for a wiring board.

Working Example 2

Lower-layer copper foil with a thickness of 12 µm was coated with the polyamic acid varnish obtained in the reference example, and the solvent was vaporized in a continuous furnace at 80 to 170° C., yielding a polyamic acid layer as a polyimide precursor layer.

An upper circuit layer was subsequently formed by a semi-additive technique on the polyamic acid layer. Specifically, a protective film was pasted over the surface of the lower-layer copper foil, an Ni layer was deposited by sputtering in a thickness of about 200 Å on the polyamic acid layer, a Cu layer was deposited thereon in a thickness of about 1000 Å, and a conductor circuit pattern resistor layer was formed on the thin film. An electrolytic copper plating layer was deposited in a thickness of 18 µm by electroplating, and the conductor circuit pattern resistor layer was subsequently peeled off. An upper circuit layer 23 was then formed by subjecting the entire surface to soft etching with a mixed solution of hydrogen peroxide and sulfuric acid, and the protective film was then peeled off.

The laminate comprising a lower-layer copper foil, a polyamic acid layer, and an upper circuit layer was subsequently introduced into a heat-treatment apparatus, the temperature of the atmosphere inside the apparatus was raised to 230 to 350° C., and the laminate was imidated for 30 minutes at 350° C. to convert the polyamic acid layer to a polyimide insulating layer. A double-sided flexible printed board was thus obtained.

The lower-layer copper foil of the resulting double-sided flexible printed board was patterned in the same manner as the upper-layer copper foil, yielding a lower circuit layer. A double-sided flexible printed wiring board was subsequently obtained by forming polyimide cover coat layers (UR-5480, manufactured by Toray) on the upper circuit layer and the lower circuit layer.

The resulting double-sided flexible printed wiring board was tested and evaluated for its heat resistance, dimensional stability, adhesion, and long-term aging characteristics in the same manner as in Working Example 1.

Heat Resistance

The manner in which the wiring board was affected was analyzed by the same method as in Working Example 1 except that the temperature of the solder bath was set to 300° C. The wiring board of Working Example 2 did not swell, and no pattern peeling was observed. These results suggested that the moisture content of the polyimide insulating layer had been reduced.

Dimensional Stability

When measured by the same method as in Working Example 1, the deformation was found to be low (5 mm or less).

Adhesion

When measured by the same method as in Working Example 1, the peel strength was found to be 0.8 kg/cm, which was adequate in practical terms.

Long-term Aging Characteristics

Measurements were performed in the same manner as in Working Example 1, and the same results were obtained.

Working Example 3

Lower-layer copper foil with a thickness of 12 µm was coated with the polyamic acid varnish obtained in the reference example, and the solvent was vaporized in a continuous furnace at 80 to 170° C., yielding a polyamic acid layer as a polyimide precursor layer.

Upper-layer copper foil with a thickness of 12 µm was subsequently superposed on the polyamic acid layer and thermocompression-bonded thereto using 200° C. pressure rolls (surface pressure: 60 kg/cm$^2$).

Through holes serving as vias were formed with the aid of an NC drill in the resulting laminate comprising a lower-layer copper foil, a polyamic acid layer, and an upper-layer copper foil, and a copper layer was formed on the inner walls of the through holes by an ordinary method to establish conductivity between the upper-layer copper foil and lower-layer copper foil.

The surface of the lower-layer copper foil was subsequently covered with a protective film, a conductor circuit pattern resistor layer was then formed on the upper-layer copper foil, and the upper-layer copper foil was etched with a cupric chloride aqueous solution or other etching solution, yielding an upper circuit layer. The conductor circuit pattern resistor layer and the protective film were then peeled off.

The resulting laminate, which comprises a lower-layer copper foil, a polyamic acid layer, and an upper circuit layer and in which conductivity was established between the lower-layer copper foil and the upper circuit layer by means of through holes, was subsequently introduced into a heat-treatment apparatus, the temperature of the atmosphere inside the apparatus was raised to 230 to 350° C., and the laminate was imidated for 30 minutes at 350° C. to convert the polyamic acid layer to a polyimide insulating layer. A double-sided flexible printed board was thus obtained.

The lower-layer copper foil of the resulting double-sided flexible printed board was patterned in the same manner as the upper-layer copper foil, yielding a lower circuit layer. A double-sided flexible printed wiring board was subsequently obtained by forming polyimide cover coat layers (UR-5480, manufactured by Toray) on the upper circuit layer and lower circuit layer. All these procedures were performed as roll-to-roll operations.

The resulting double-sided flexible printed wiring board was tested and evaluated for its heat resistance, dimensional stability, adhesion, and long-term aging characteristics in the same manner as in Working Example 1.

Heat Resistance

The manner in which the wiring board was affected was analyzed by the same method as in Working Example 1. No swelling or pattern peeling was observed. These results suggested that the moisture content of the polyimide insulating layer had been reduced.

Dimensional Stability

When measured by the same method as in Working Example 1, the deformation was found to be low (5 mm or less).

Adhesion

When measured by the same method as in Working Example 1, the peel strength was found to be high (1.2 kg/cm).

Long-term Aging Characteristics (1) Measurements were performed by the same method as in Working Example 1, and it was found that the peel strength had not decreased (1.0 kg/cm).

(2) Measurements were performed by the same method as in Working Example 1, and the value was found to be 1.0×10E+12, indicating that the insulation properties were adequate for a wiring board.

According to the manufacturing method of the present invention, the polyimide precursor layer is imidated after the metal layer on one side has been patterned, so the moisture generated during imidation evaporates off through the patterned metal layer, making it possible to prevent the metal layer from being corroded by the moisture generated during imidation. In addition, the double-sided flexible printed board has adequate long-term aging characteristics because the polyimide insulating layer obtained by imidation has excellent heat resistance and dimensional stability, and adheres well to the metal layers on both sides. Furthermore, excellent handling is achieved because patterning is not performed on one side of the metal layers during imidation. Another feature is that the positioning accuracy for lamination does not need to be as high as in Japanese Patent No. 2746643.

The entire disclosure of the specification, claims, summary and drawings of Japanese Patent Application No.10-373092 filed on Dec. 28, 1998 is hereby incorporated by the reference.

What is claimed is:

1. A method for manufacturing a double-sided flexible printed board, comprising the following steps of:
   (A) forming a polyimide precursor layer on a metal layer;
   (B) forming an upper circuit layer on the polyimide precursor layer by a semi-additive technique, leaving the polyimide precursor layer partially exposed at the upper circuit layer side; and
   (C) after step (B), imidating the partially exposed polyimide precursor layer to form a polyimide insulating layer.

2. The method according to claim 1, wherein step (M) in which the formation of a through hole for ensuring conductivity between the metal layer and the upper circuit layer is performed between step (B) and step (C) or subsequent to step (C).

3. A method for manufacturing a double-sided flexible printed board, comprising the following steps of:
   (A) forming a polyimide precursor layer on a metal layer;
   (B) forming an upper circuit layer on the polyimide precursor layer by a semi-additive technique, leaving the polyimide precursor layer partially exposed at the upper circuit layer side; and
   (C) imidating the polyimide precursor layer, while the polyimide precursor layer includes the upper circuit layer that has been formed on the polyimide precursor layer, to form a polyimide insulating layer.

4. The method according to claim 3, wherein step (M) in which the formation of a through hole for ensuring conductivity between the metal layer and the upper circuit layer is performed between step (B) and step (C) or subsequent to step (C).

5. A method for manufacturing a double-sided flexible printed board, comprising the following steps of:
   (A) forming a polyimide precursor layer on a metal layer;
   (B) forming an upper circuit layer on the polyimide precursor layer by a semi-additive technique, leaving the polyimide precursor layer partially exposed at the upper circuit layer side; and
   (C) after step (B), imidating the polyimide precursor layer to form a polyimide insulating layer.

6. The method according to claim 5, wherein step (M) in which the formation of a through hole for ensuring conductivity between the metal layer and the upper circuit layer is performed between step (B) and step (C) or subsequent to step (C).

* * * * *